(12) United States Patent
Hedler et al.

(10) Patent No.: US 7,265,451 B2
(45) Date of Patent: Sep. 4, 2007

(54) SEMICONDUCTOR AND METHOD FOR PRODUCING A SEMICONDUCTOR

(75) Inventors: Harry Hedler, Germering (DE); Roland Irsigler, Munich (DE)

(73) Assignee: Infineon Technologies AG, Munich (DE)

( * ) Notice: Subject to any disclaimer, the term of this patent is extended or adjusted under 35 U.S.C. 154(b) by 181 days.

(21) Appl. No.: 11/210,387

(22) Filed: Aug. 24, 2005

(65) Prior Publication Data
US 2006/0043573 A1 Mar. 2, 2006

(30) Foreign Application Priority Data
Aug. 30, 2004 (DE) .................. 10 2004 041 889

(51) Int. Cl.
*H01L 23/02* (2006.01)
(52) U.S. Cl. .............. 257/777; 257/723; 257/686; 438/109; 438/110
(58) Field of Classification Search ......... 257/777, 257/723, 678; 438/109, 110
See application file for complete search history.

(56) References Cited

U.S. PATENT DOCUMENTS

| | | | |
|---|---|---|---|
| 5,939,779 A | | 8/1999 | Kim |
| 6,093,584 A | | 7/2000 | Fjelstad |
| 6,118,176 A | * | 9/2000 | Tao et al. ............ 257/676 |
| 6,177,721 B1 | * | 1/2001 | Suh et al. ............ 257/686 |
| 6,506,632 B1 | | 1/2003 | Cheng et al. |
| 6,696,320 B2 | | 2/2004 | Gacusan |
| 2002/0146859 A1 | | 10/2002 | Akagawa |
| 2004/0084771 A1 | | 5/2004 | Bolken et al. |

* cited by examiner

*Primary Examiner*—Roy Potter
(74) *Attorney, Agent, or Firm*—Jenkins, Wilson, Taylor & Hunt, P.A.

(57) ABSTRACT

A semiconductor device comprises at least one first semiconductor component being located in a first plane and comprising an active area which has a first contact region and at least one second semiconductor component being located in a second plane and comprising a second active area which has a second contact region. The second semiconductor component is located at a distance vertically to the first semiconductor component and is orientated relative to the first semiconductor component, so that the first active area faces away from the second semiconductor component and the second active area faces away from the first semiconductor component. An adhesive layer is arranged between the first and the second semiconductor components and a frame region adjoins laterally the first semiconductor component and the second semiconductor component on at least one side. The frame region comprises a first surface and a second surface which is located opposite to the second surface. A wiring device is introduced in the frame region and connects the first contact region to the second contact region.

45 Claims, 15 Drawing Sheets

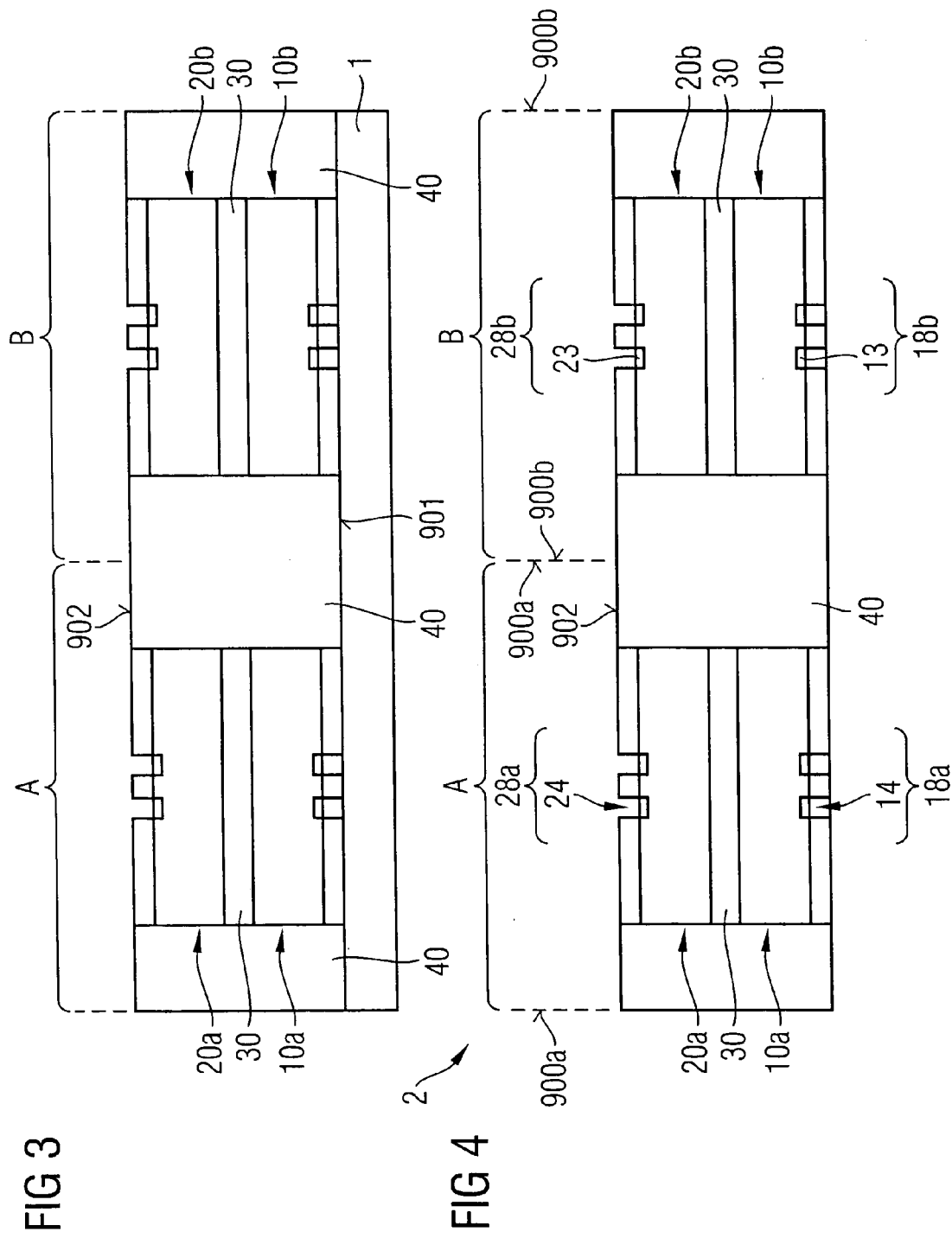

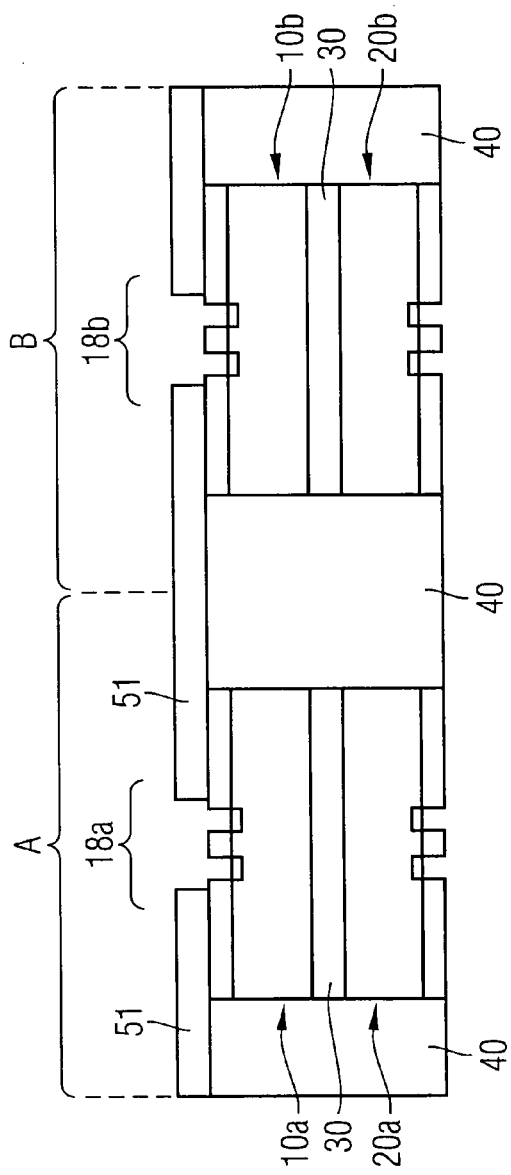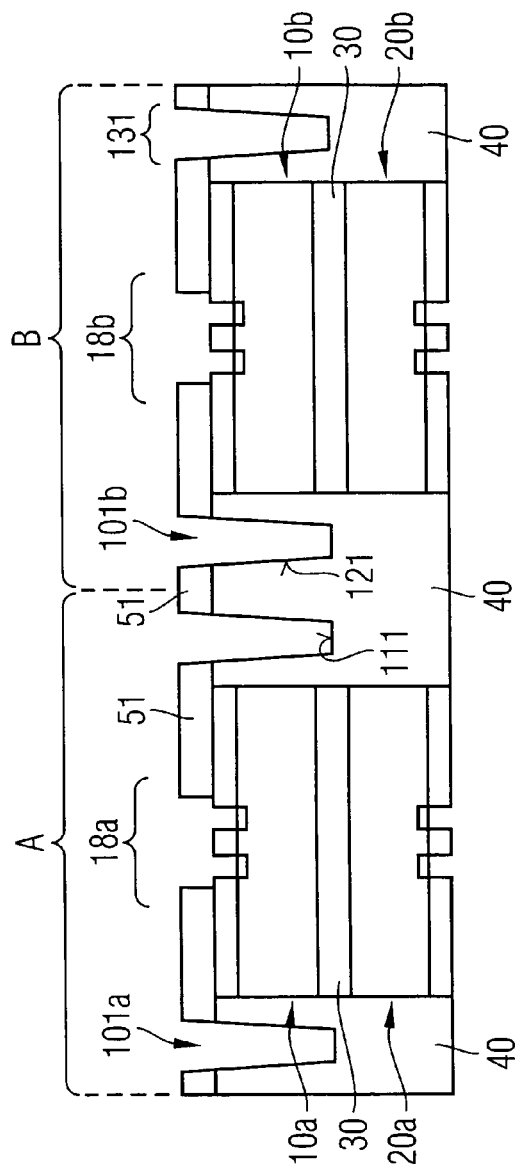

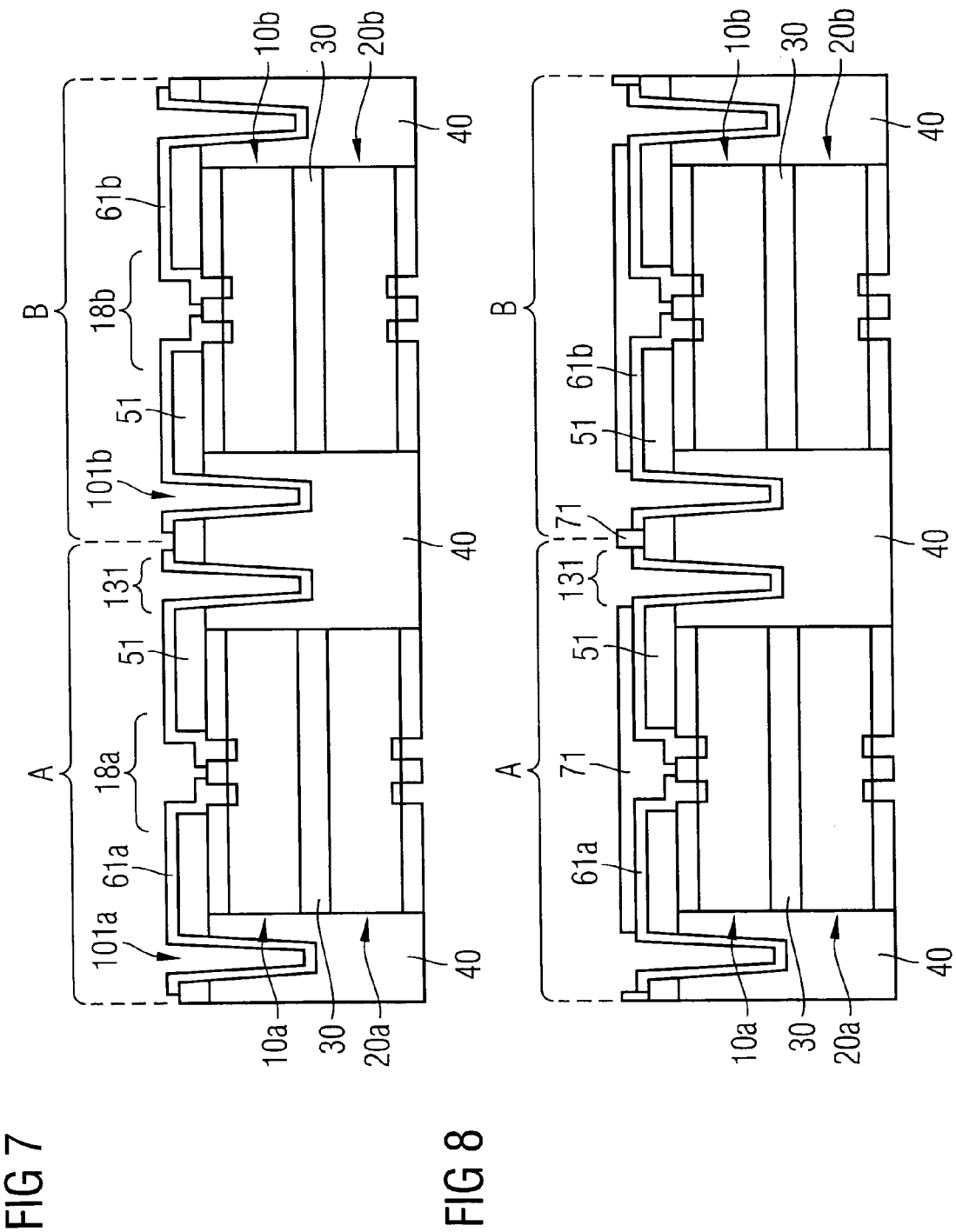

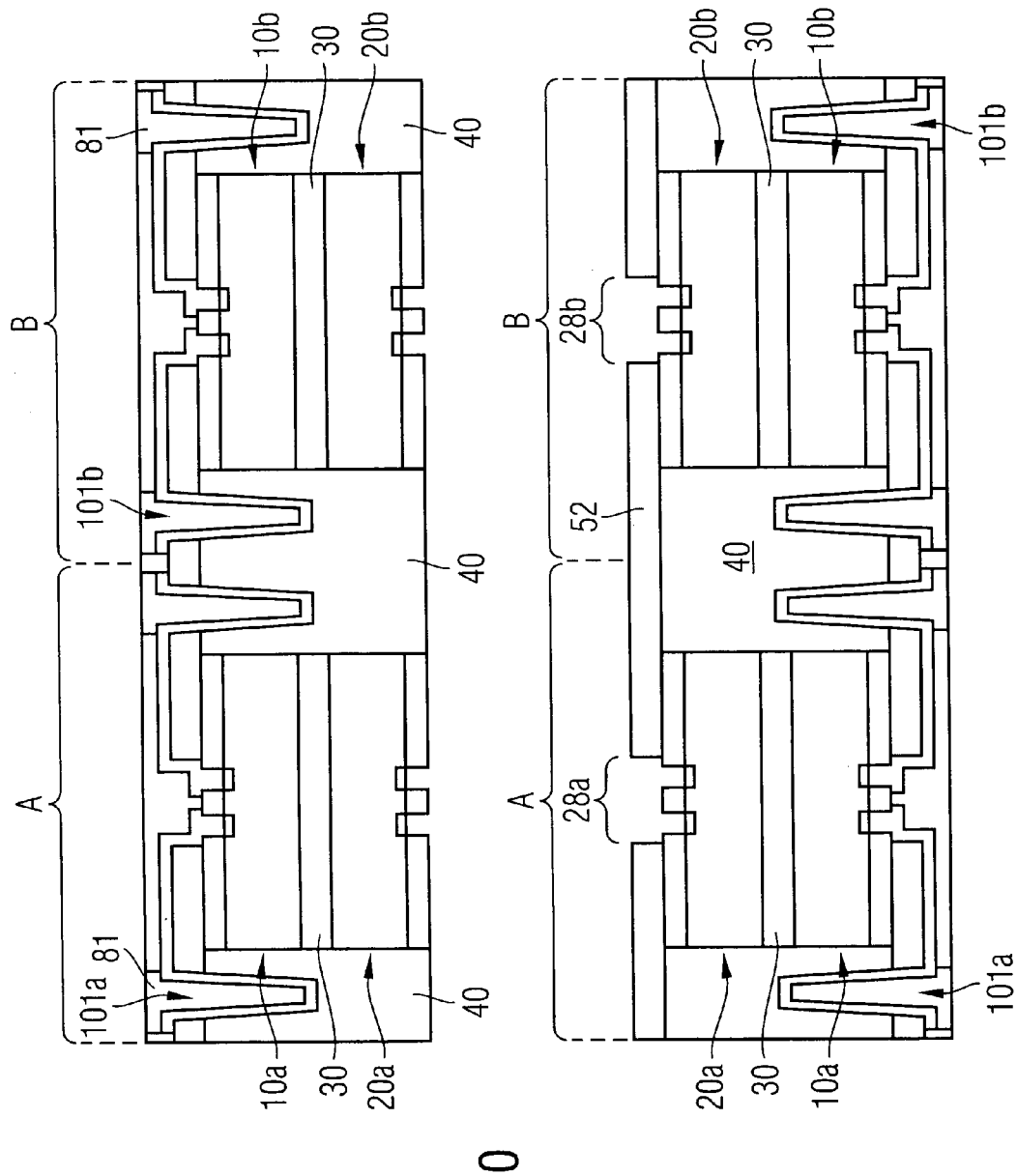

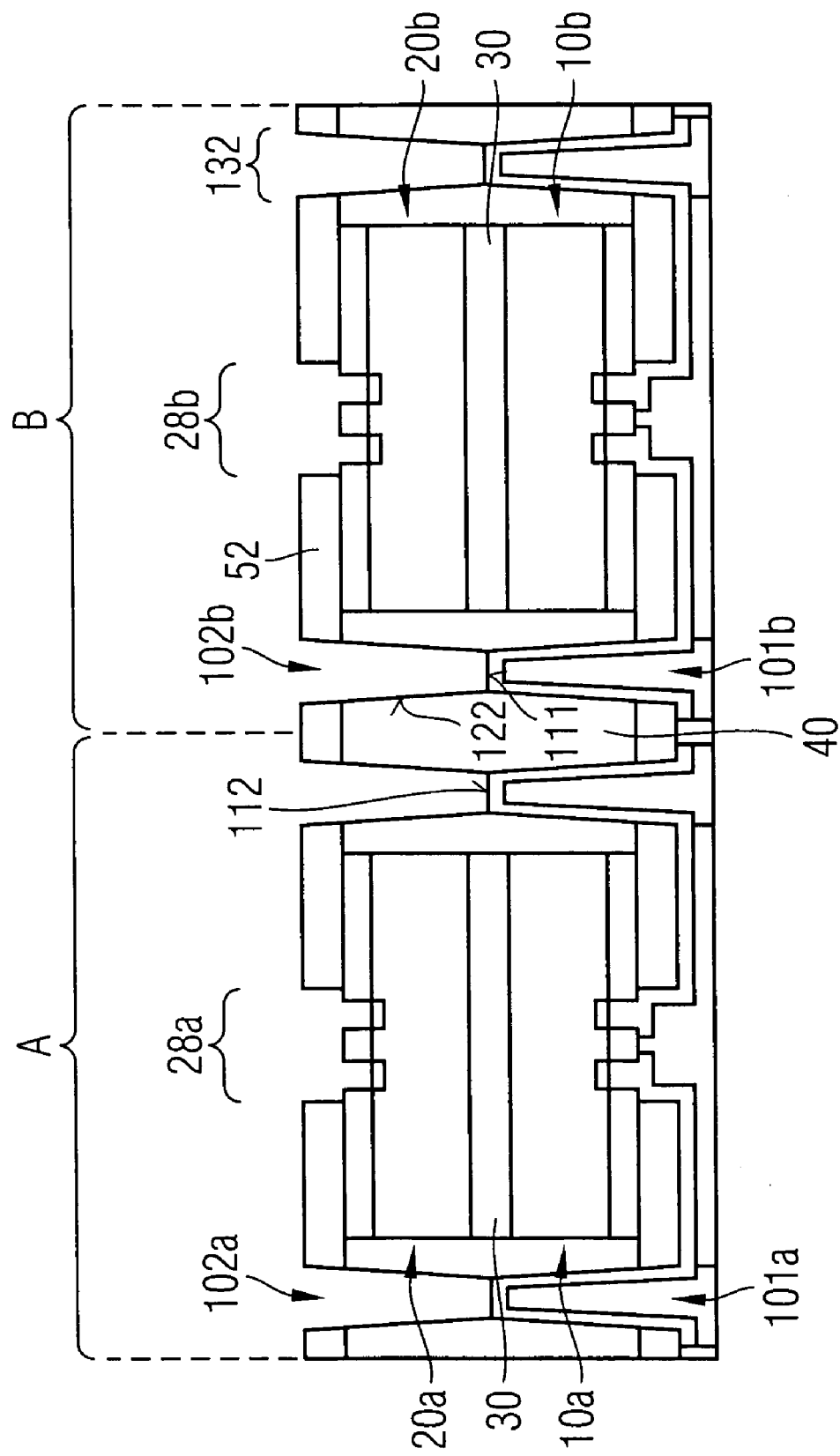

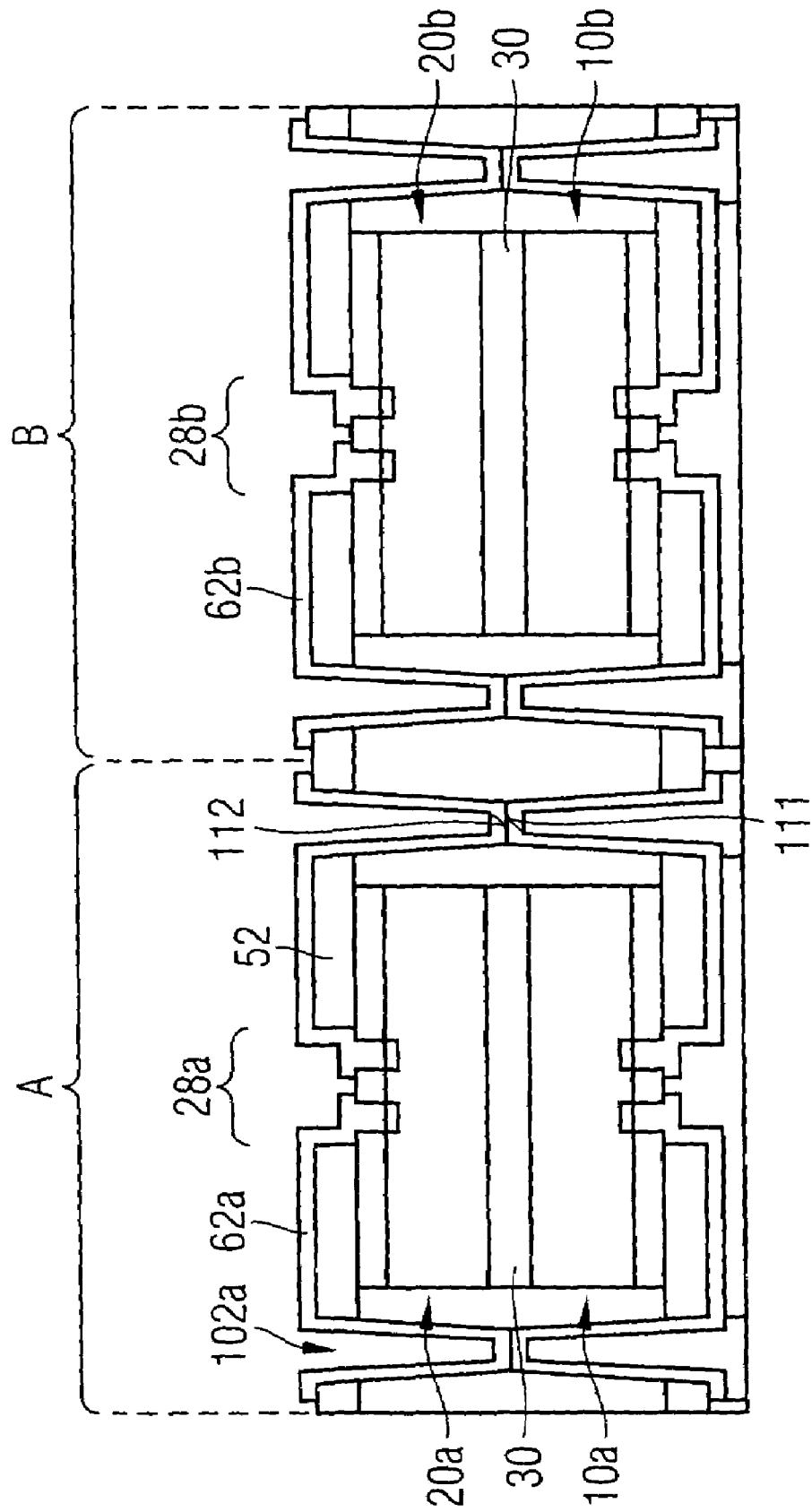

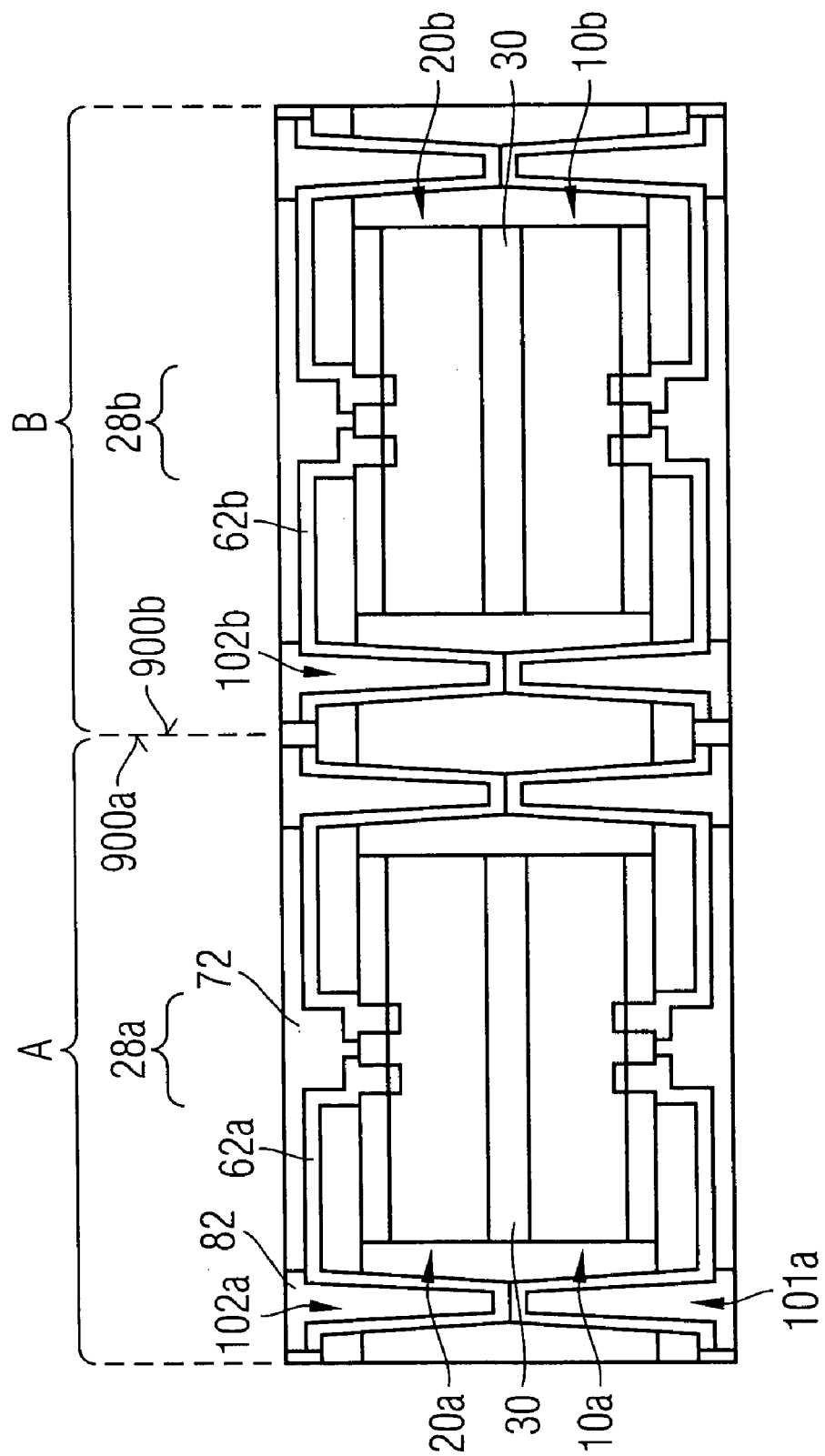

SEMICONDUCTOR AND METHOD FOR PRODUCING A SEMICONDUCTOR

BACKGROUND OF THE INVENTION

1. Field of the Invention

The invention relates to a semiconductor device having stacked semiconductor components and a method for producing a semiconductor device having stacked semiconductor components.

2. Description of the Related Art

Although applicable, in principle, to any desired integrated circuits, the present invention and the problems on which it is based will be explained with reference to integrated memory circuits.

In memory circuit technology, preference is given to arrangements of memory components which allow extremely short rewirings between the individual components. This is expedient in order to achieve short signal propagation times between the memory components and, in this manner, to enable short latencies and a high data transfer rate. The power losses in the rewirings as well as the capacitance of the rewiring are also reduced.

As the integration density of present-day semiconductor technology increases, a more and more compact design in one plane is enabled. The integration density can be increased further by stacking the memory components one above the other in a plurality of planes. One common method is to populate circuit boards on two sides. This makes it possible for at least two semiconductor components to be arranged one above the other. A plurality of such populated circuit boards may also be stacked and vertically contact-connected using cables or plug connections. However, this results in high costs for contact-connecting and installing the circuit boards. It is not possible to considerably reduce the wiring lengths and the parasitic capacitances either.

Other methods provide for the memory components to be placed directly on top of one another. In one arrangement, two semiconductor housings (TSOP housings) are stacked on top of one another and the external contact connections (pins) are soldered to one another. Another variant provides for two unhoused semiconductor components (dies) to be placed on top of one another and for a respective contact of the two unhoused semiconductor components to be internally wired (bonded) internally to the same external contact of a housing. However, the structural height of such a stack is too great for many applications and, in addition, only a few (two to three) components can be stacked. The rewirings also have a capacitance and inductance which are too high, on account of their length and the large number of contact connections, for such a stack to be suitable for radiofrequency applications. Moreover, the impedance of the rewirings is not matched.

Another device places a semiconductor component in a prefabricated housing. This housing has external contacts toward its underside and external contacts toward its top side, which contacts are respectively connected to one another. During the production method, the contacts are internally wired to an unhoused semiconductor component. A plurality of semiconductor components can thus be vertically integrated by stacking the housings.

The disadvantage is that the prefabricated housings must be made and stocked in accordance with the functionality of the semiconductor components. Given changing dimensions of the semiconductor components on account of an increased integration density and/or extended range of functions, new housing shapes with new internal dimensions are required. In addition, their structural height is too great for many applications which is why only a few devices can be stacked. The internal rewiring also has an inductance and capacitance which are too high for the device to be suitable for radiofrequency applications.

SUMMARY OF THE INVENTION

It is an object of the present invention to provide a semiconductor device, which makes it possible to stack semiconductor components with an improved rewiring. It is also an object of the present invention to specify a method, which can be used to produce the inventive semiconductor device.

The object is achieved in accordance with the invention by means of a semiconductor device having a plurality of stacked semiconductor components. A first semiconductor component is arranged in a first plane and a second semiconductor component is arranged in a second plane. In this case, the semiconductor components are oriented in such a manner that a respective inactive side of a semiconductor component faces the other semiconductor component. An adhesive layer is introduced between the semiconductor components. A stack formed in this manner is at least partially surrounded by a frame region, in which a rewiring device that connects the first and second semiconductor components is provided.

The object is also achieved in accordance with the invention by means of a method for producing a semiconductor device having the following steps: providing a temporary substrate, to which at least one stack having the above-described geometry and comprising a first semiconductor component, an adhesive layer and a second semiconductor component is gradually applied. Edge regions between stacks which have been formed in this manner are filled with a curable potting compound and the temporary substrate is then removed from the self-supporting structure. In the following steps, a rewiring device is formed in the frame region and the rewiring device is connected to the contact regions. Once the individual semiconductor devices have been fabricated, the self-supporting structure is divided into the individual semiconductor devices.

The advantages of the inventive device reside, in particular, in the fact that the internal rewiring of individual semiconductor components in a semiconductor device can be produced in a cost-effective manner using thin-film and/or thick-film technology. In addition, the inventive method enables production in a highly parallel assembly.

In accordance with a particularly preferred development of the present invention, the rewiring device in the frame region is formed from a first and a second rewiring. To this end, depressions are introduced into the frame region from both sides in such a manner that the two rewirings touch. Another development provides for the depression to be introduced only from one side and for the other depression to be configured in such a manner that it has the total height of the stack. A preferred development provides for these depressions to be introduced into the frame using a laser.

In order to improve the mechanical properties of the semiconductor device, further developments provide for a buffer layer to be introduced in addition to the semiconductor components. The adhesive layer may additionally have a core substrate having increased rigidity.

Further developments of the invention result from arranging more than one semiconductor component in one or both planes.

A plurality of exemplary embodiments of the invention are illustrated in the drawings and are explained in more detail in the following description.

DESCRIPTION OF THE DRAWINGS

FIGS. 1-14 are diagrammatic illustrations of successive stages of one embodiment during a production method;

DESCRIPTION OF THE PREFERRED EMBODIMENTS

In the figures, identical reference symbols denote identical or functionally identical components. In the figures, not all of the reference symbols are shown at the same time for reasons of clarity. In this case, each figure is to be compared with the preceding figures and the reference symbols are to be adopted analogously.

Figure 1:
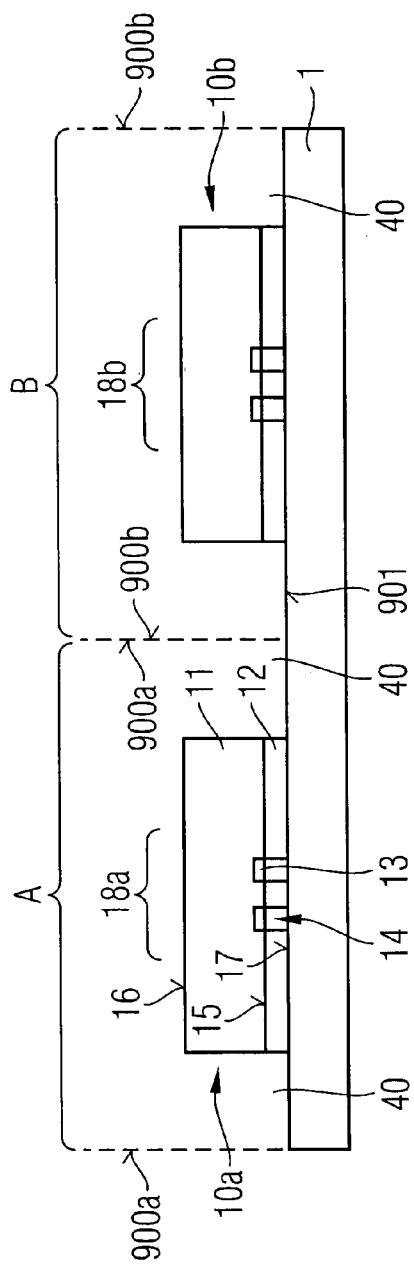

FIG. 1 shows a diagrammatic illustration of a first stage of one embodiment during a production method. Part of a temporary substrate 1 having a first surface 901 is shown. The temporary substrate 1 is preferably a film. A subdivision into device regions A, B is laterally provided. The edges 900a, 900b of the device regions A, B prescribe the dimensions of the semiconductor devices produced by means of the embodiment of the method. In each device region A, B, a first semiconductor component 10a, 10b is placed onto the surface 901. The first semiconductor components 10a, 10b have a substrate region 11 having an active side 15 and an inactive side 16. A contact-connection region 18a, 18b of the first semiconductor components 10a, 10b is situated on the active side 15, the chip connection regions 13 being situated in said contact-connection region. The active side 15, except for a depression 14, is covered by a passivation layer 12 over the chip connection regions 13. The first semiconductor components 10a, 10b are applied such that the active side 15 is oriented toward the substrate. An edge region 40 that is unoccupied for the time being is situated between the edge 900a, 900b of the device regions A, B and the first semiconductor components 10a, 10b. This edge region 40 may, on the one hand, enclose each first semiconductor component 10a, 10b or may occupy at least one side of the first semiconductor component 10a, 10b.

Figure 2:
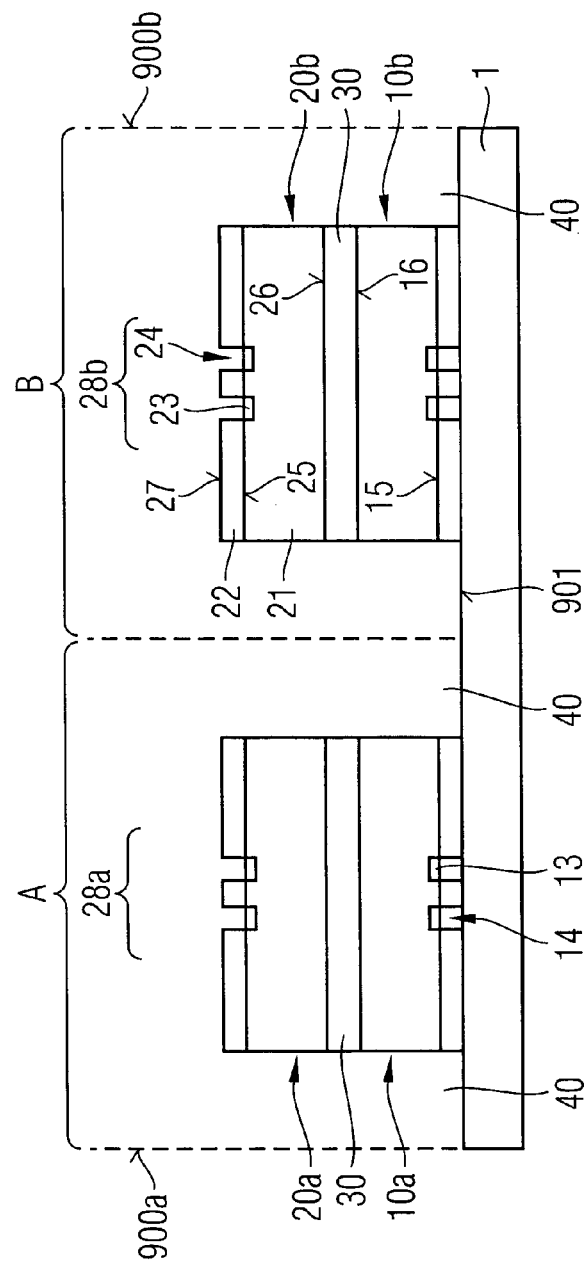

In FIG. 2, an adhesive layer 30 is first of all applied to the inactive side of the semiconductor components 10a, 10b by means of a further production step. Second semiconductor components 20a, 20b are applied to this adhesive layer 30. In this embodiment, the first and second semiconductor components 10a, 20a are of identical design. However, this is not to be regarded as being restrictive. Rather, it is envisaged to also integrate functionally different semiconductor components within a housing. The active areas 26, and the contact regions 28a, 28b situated thereon, of the second semiconductor components 20a, 20b are oriented such that they face away from the first semiconductor components 10a, 10b. The first and second semiconductor components 10a, 10b, 20a, 20b form two stacks, the first and second semiconductor components being arranged with their backs to one another (back-to-back). The second semiconductor components 20a, 20b are at a distance from the edge 900a, 900b of the device regions A, B. However, this distance does not necessarily correspond to the distance between the first semiconductor components 10a, 10b and the edge 900a, 900b, as illustrated in FIG. 2.

The edge region 40 is filled with a potting compound (see FIG. 3 in this respect). In this case, inter alia, further steps (which have not been carried out) are needed to ensure that the potting compound terminates flush with the second semiconductor components 20a, 20b with a planar second surface 902. The potting compound forms a self-supporting structure 2. The temporary substrate 1 can therefore be removed from the first surface 901 in a subsequent step. FIG. 4 illustrates the self-supporting structure with the planar first and second surfaces 901 and 902.

FIGS. 5-13 which are described below explain the production of a rewiring device 61a, 61b, 62a, 62b by means of contact vias in the edge region 40 and the rewiring of the first and second semiconductor components 10a, 10b, 20a, 20b using the rewiring device 61a, 61b, 62a, 62b. In this case, it is particularly important that the rewiring device 61a, 61b, 62a, 62b is used to achieve a rewiring between the first and second semiconductor components 10a, 10b, 20a, 20b.

In a first step, a dielectric 51 is applied to the first surface 901. The dielectric 51 is patterned using a known technique, for example a lithographic method, in such a manner that the contact-connection regions 18a, 18b of the first semiconductor components 10a, 10b are not covered by the dielectric 51 (FIG. 5). The dielectric 51 is also removed in the opening regions 131 above the frame region 40. First depression 101a, 101b are produced in the potting compound in the frame region 40 beneath the exposed opening regions 131. A depression 101a, 101b has a bottom region 111 and side walls 121. The bottom region 111 is preferably flat. This may be effected, for example, using powerful lasers. The depth of the depression 101a, 101b is illustrated in FIG. 6 as half the height of the stack. However, this is only one possible embodiment and there is no restriction in terms of the depth of the first depression.

In a subsequent step (FIG. 7), a conductive layer is deposited onto the first surface 901 that has just been patterned. In this case, the conductive layer is deposited on the bottom region 111, the side walls 121, the dielectric layer 51 and the first contact regions 18a, 18b. In this manner, the bottom regions 111 and the first contact-connection regions 18a, 18b are electrically connected. Lithographic patterning steps before and/or after the conductive layer is applied are used to produce a rewiring on the first surface 901. The conductive layer preferably comprises aluminum or copper. In order to protect the rewiring, a covering layer 71, for example a protective lacquer, is applied. However, this does not cover the depression 101a, 101b (FIG. 8). A plug 81 comprising a conductive material is introduced into the depression 101a, 101b (FIG. 9). The plug 81 is used to externally contact-connect the stack comprising the semiconductor components 10a, 20a.

A dielectric 52 that is patterned analogously to the dielectric 51 on the first surface is first of all applied to the second surface 902 (FIG. 10). Second depression 102a, 102b are introduced into the frame region 40 through second opening regions 132 above the frame region 40. The second opening regions 132 and the second depression 102a, 102b are arranged in such a manner that they are opposite the first depression 101a, 101b. The depth of the second depression 102a, 102b is selected in such a manner that the bottom of the second depression 102a, 102b touches the bottom of the first depression 101a, 101b. As a result of the previous application of the conductive film to the first depression

101*a*, 101*b*, the underside of this conductive film is now exposed as a result of the second depression 102*a*, 102*b* (cf. FIG. 11 in this respect).

Subsequent application of a second conductive film to the patterned second surface 902 (FIG. 12) achieves, on the one hand, a second rewiring 52 of the contact region 28*a*, 28*b* of the second semiconductor component 20*a*, 20*b* to the bottom region 112 of the second depressions 102*a*, 102*b*. At the same time, this also achieves a rewiring between the first and second semiconductor components 10*a*, 20*a* since the two rewirings 51, 52 are in contact in the region of the two bottom regions 111, 112.

Subsequent steps comprise passivating the second rewiring 52 with a covering layer 72 and introducing second plugs 82 into the second depression 102*a*, 102*b* (FIG. 13).

Figure 14:
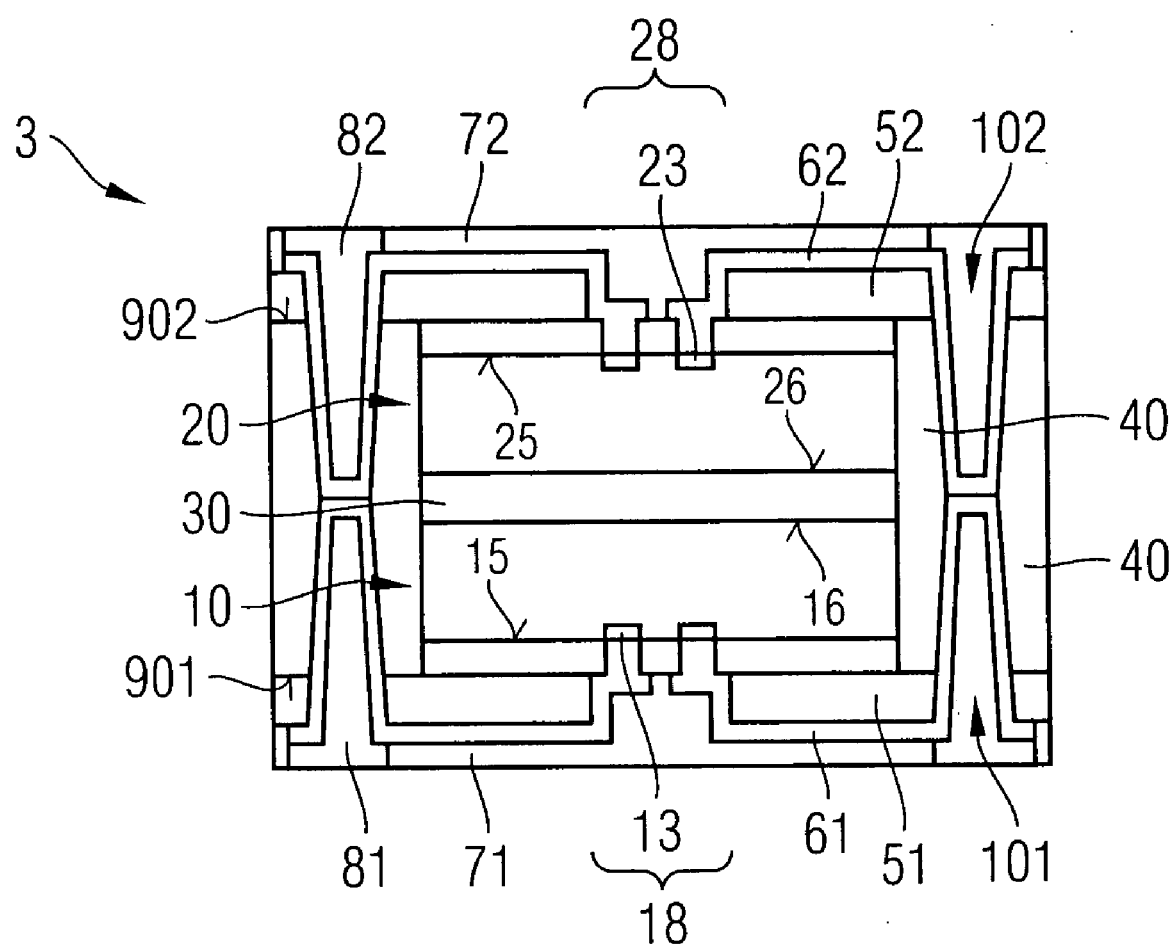

In one of the final steps, the self-supporting structure 2 is divided into individual semiconductor devices 3. Division is effected along the edges 900*a*, 900*b* of the device regions A, B. FIG. 14 illustrates one individual semiconductor device 3. The reference symbols have been shortened to the digits since it is not necessary to distinguish between first and second device regions A, B.

Figure 15:
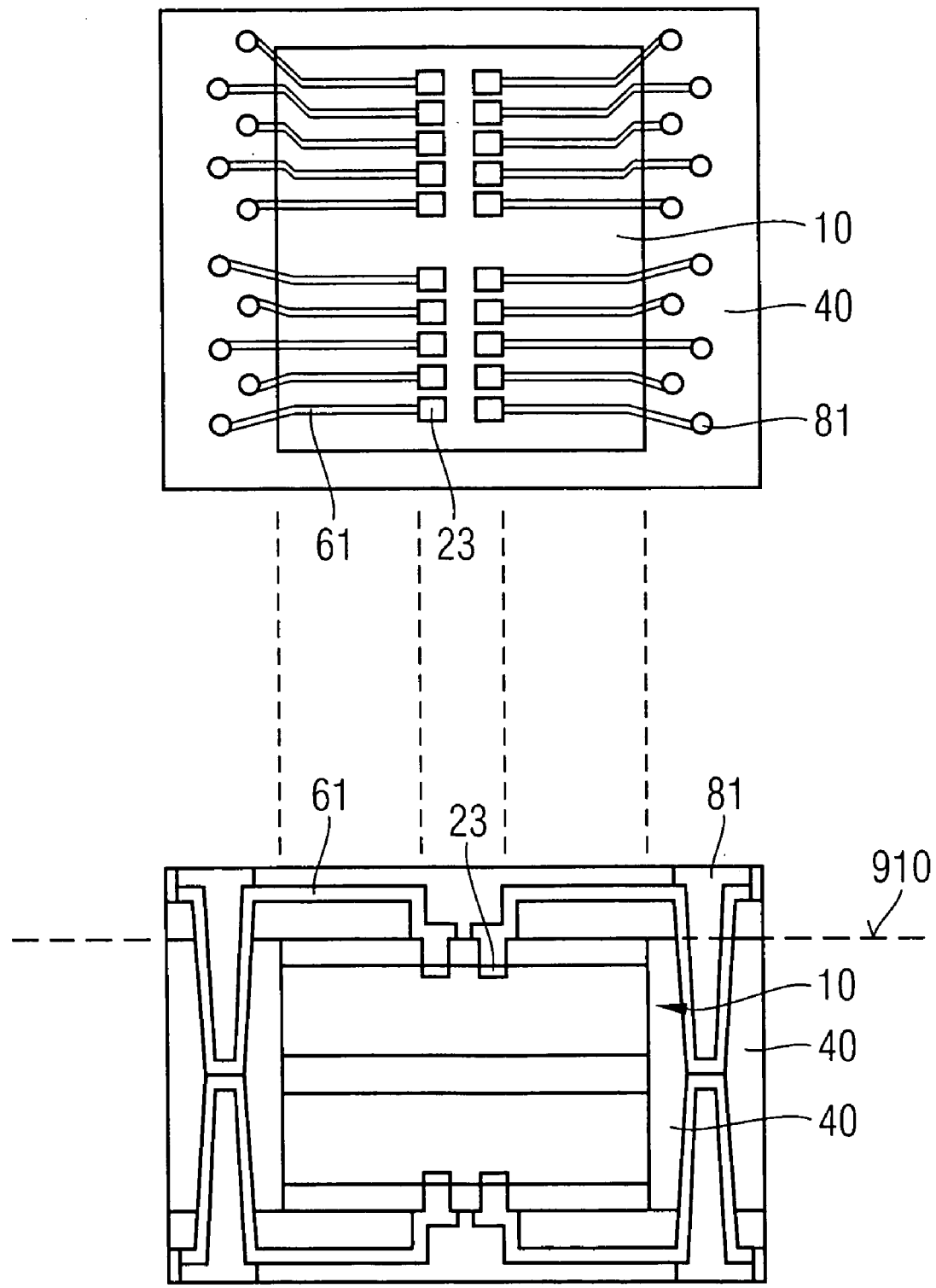
FIG. 15 is a diagrammatic illustration of a plan view of the embodiment.

FIG. 15 diagrammatically illustrates a plan view of the embodiment along the line 910. The plugs 81 are arranged in the frame region 40 of the semiconductor device. The large distances between the plugs 81 as a result of their arrangement in the external frame region 40 advantageously facilitates the installation and contact-connection of the housing on a circuit board. The positioning of the plugs 81 is prescribed only by the steps which produce the depressions 101*a*, 101*b*. The other steps are not affected thereby. The housing can therefore be advantageously adapted to the external rewiring solely by changing these steps. In this case, the positioning of the second plugs 82 is to be adapted, if appropriate. It should be noted that, advantageously, not all of the first and second depressions are arranged one above the other since, for example, not all of the pins of a first semiconductor component 10*a* are intended to be connected to a second semiconductor component 20*a* but rather external connections to a surface are desired.

In other embodiments (not illustrated), shielding areas are deposited in a parallel manner parallel to the rewirings 51, 52. Said shielding areas are applied in a preceding and/or subsequent step. In this case, a dielectric layer is additionally applied between the shielding areas and the rewirings 51, 52. The impedance of the rewirings 51, 52 can be matched by means of these additional layers. To this end, provision is made of conductive ground layers or ground wirings which run parallel to the rewirings 61, 62 and are set to a fixed potential, preferably ground potential. The conductive layers preferably comprise aluminum and/or copper. An insulation layer comprising a dielectric having a prescribed wall thickness insulates the ground layers from the rewiring 61, 62. The wall thickness is to be selected in such a manner that, with the geometrical requirements of the rewirings and of the dielectric constant, the desired impedance, typically 50 ohms, are achieved at the signal frequencies of the semiconductor components. The stacks are therefore suitable for radiofrequency applications. Since the rewiring does not need any further connecting elements in order to connect the first semiconductor components to the second semiconductor components, the inductance and capacitance are very low. This is, in turn, advantageously, inter alia, for radiofrequency applications.

Figure 16:
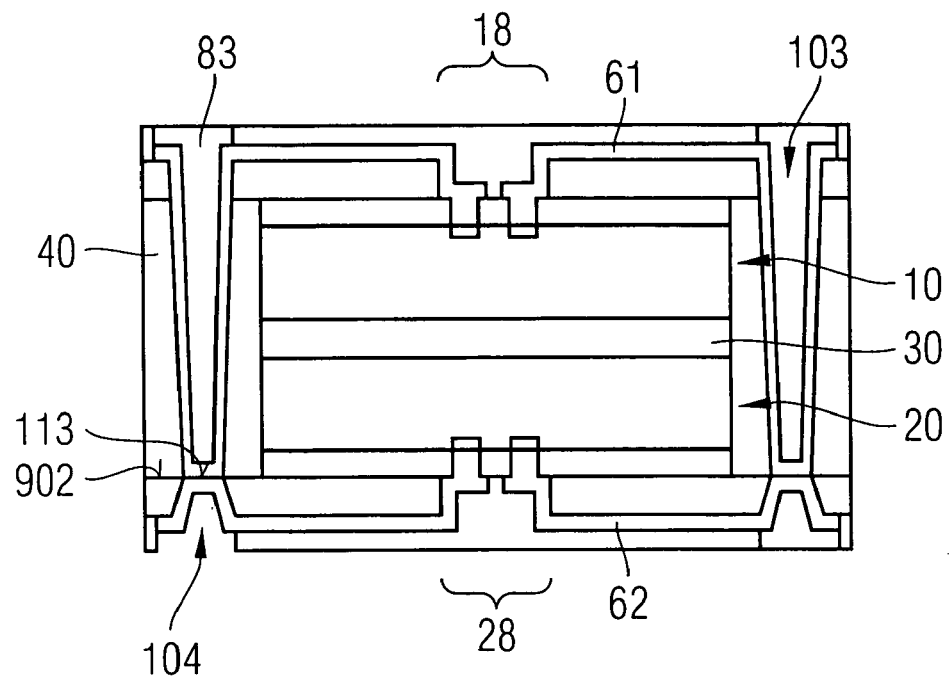
FIGS. 16-21 are diagrammatic illustrations of further embodiments.

FIG. 16 diagrammatically illustrates another embodiment of the present invention. In this case, the depressions 103 through the first surface 901 are so deep that they pierce through the entire potting compound. The bottom 113 of the depression 103 coincides with the second surface 902. As usual, the rewiring 61 on the first surface touches the rewiring 62 on the second surface. In this case, it is advantageously not necessary to introduce second depressions through the second surface 902.

Figure 17:
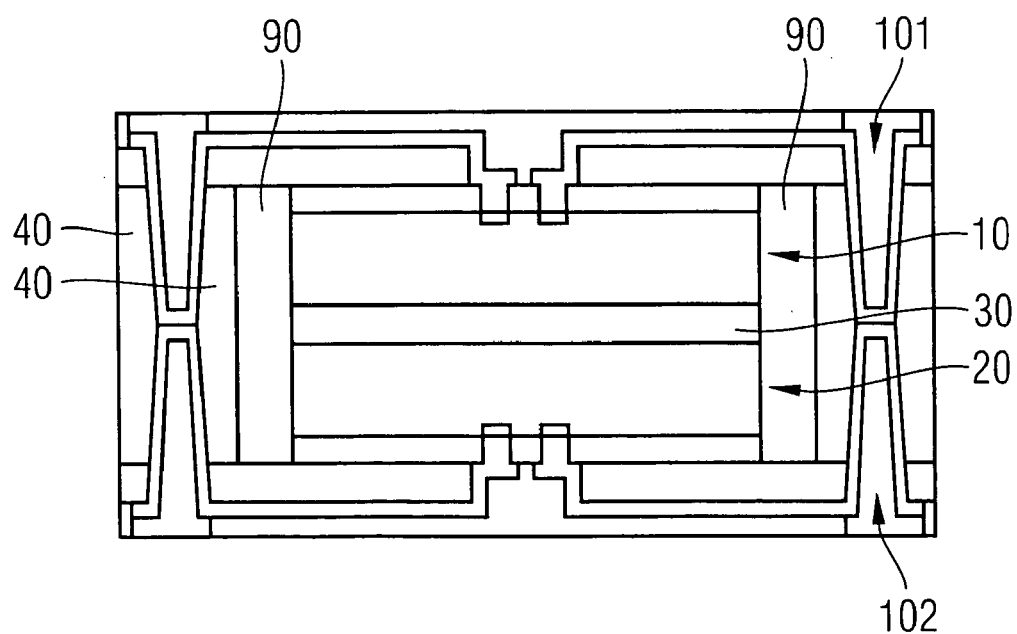

FIG. 17 diagrammatically illustrates another embodiment of the present invention. A buffer layer 90 is introduced such that it directly laterally adjoins the first and second semiconductor components 10, 20. The buffer layer 30 is soft and advantageously reduces mechanical stress within the housing, which stress is produced, inter alia, as a result of different expansions of the housing and the semiconductor components 10, 20 in the event of temperature changes.

Figure 18:
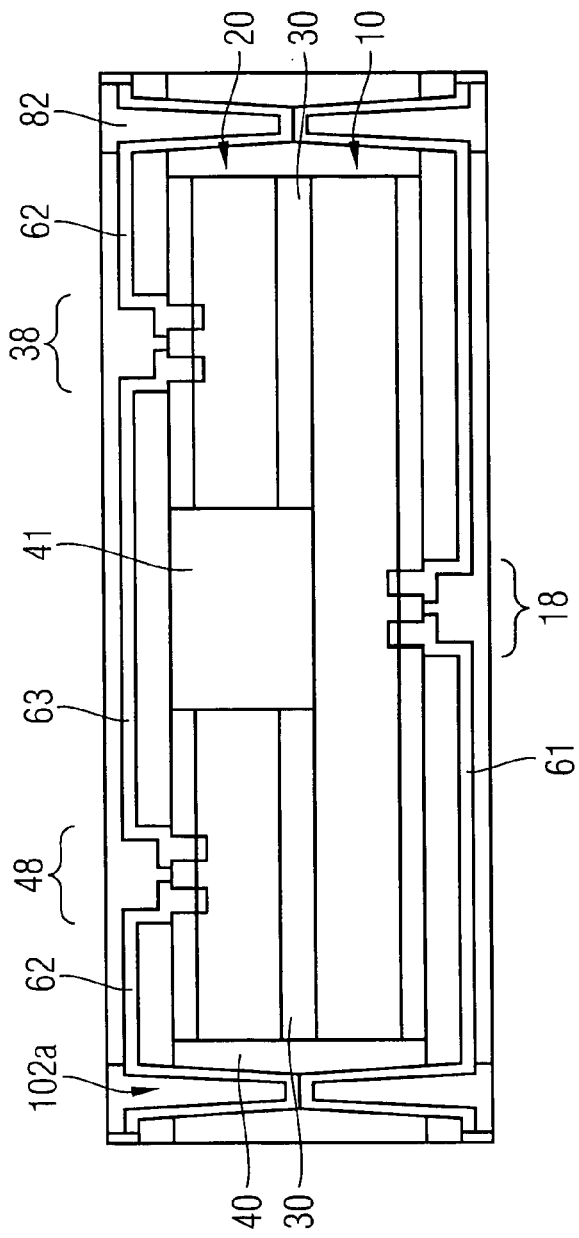

FIG. 18 diagrammatically illustrates another embodiment of the present invention. In this case, two third semiconductor components 30, 40 are arranged in one plane. A rewiring 63 between the two third semiconductor components and a rewiring 62 with the contact vias connect the first and third semiconductor components 10, 30, 40. The interspace 41 between the third semiconductor components 30, 40 is advantageously filled with a potting compound. Any desired combination possibilities of one or more semiconductor components in the two planes are conceivable.

Figure 19:
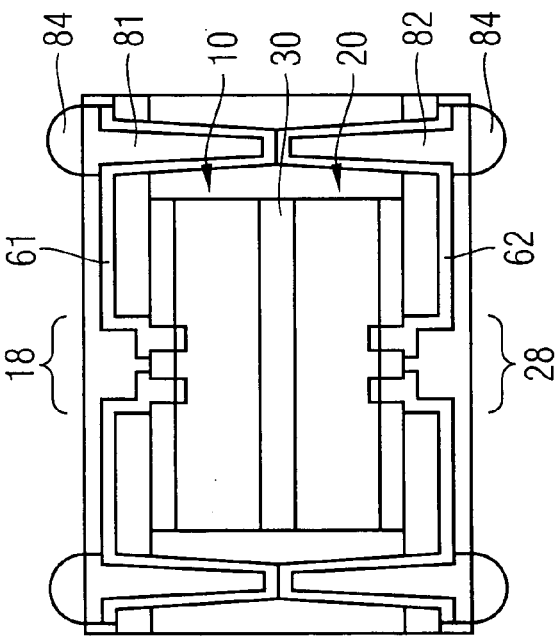

FIG. 19 diagrammatically illustrates another embodiment of the present invention. Solder deposit elevations 84 are applied to the plugs 81, 82 in order to facilitate external contact-connection. In another embodiment, the solder deposit elevations are applied only on one surface in order to stack the housings in a simpler manner. Heating a stack of a plurality of housings in a soldering furnace then results in vertical rewirings of the housings to each other and also between the semiconductor components of one housing and further semiconductor elements in other housings.

Compatibility with existing housing standards and/or customary contact-connection patterns of printed circuit boards is ensured by introducing the depression in the frame in accordance with the standards. In accordance with the embodiment described, the solder deposit elevations 84 are then situated at the desired positions.

Figure 20:
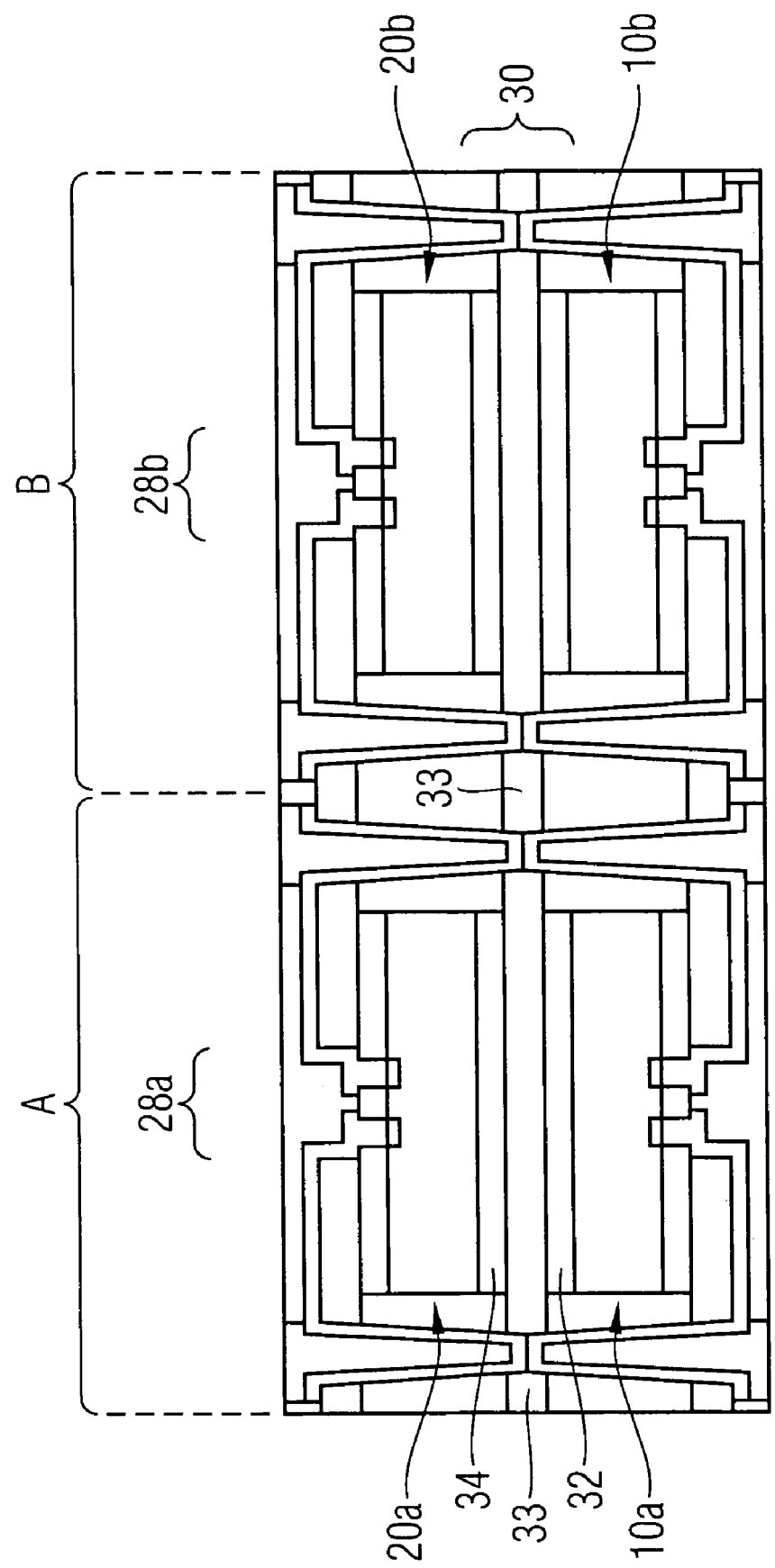

FIG. 20 diagrammatically illustrates another embodiment of the present invention. Higher mechanical strength of the housing is achieved by virtue of a core substrate 33. To this end, rigid materials are preferred for the core substrate. The core substrate is integrated in the adhesive layer 30. The opposite sides of the core substrate 33 are covered by two adhesive materials 32, 34, with the result that the core substrate is permanently connected to the first and second semiconductor components 10*a*, 20*a*. In the illustration, the core substrate 33 is a continuous layer and the depression is also to be introduced into the core substrate 33 in this embodiment.

Figure 21:
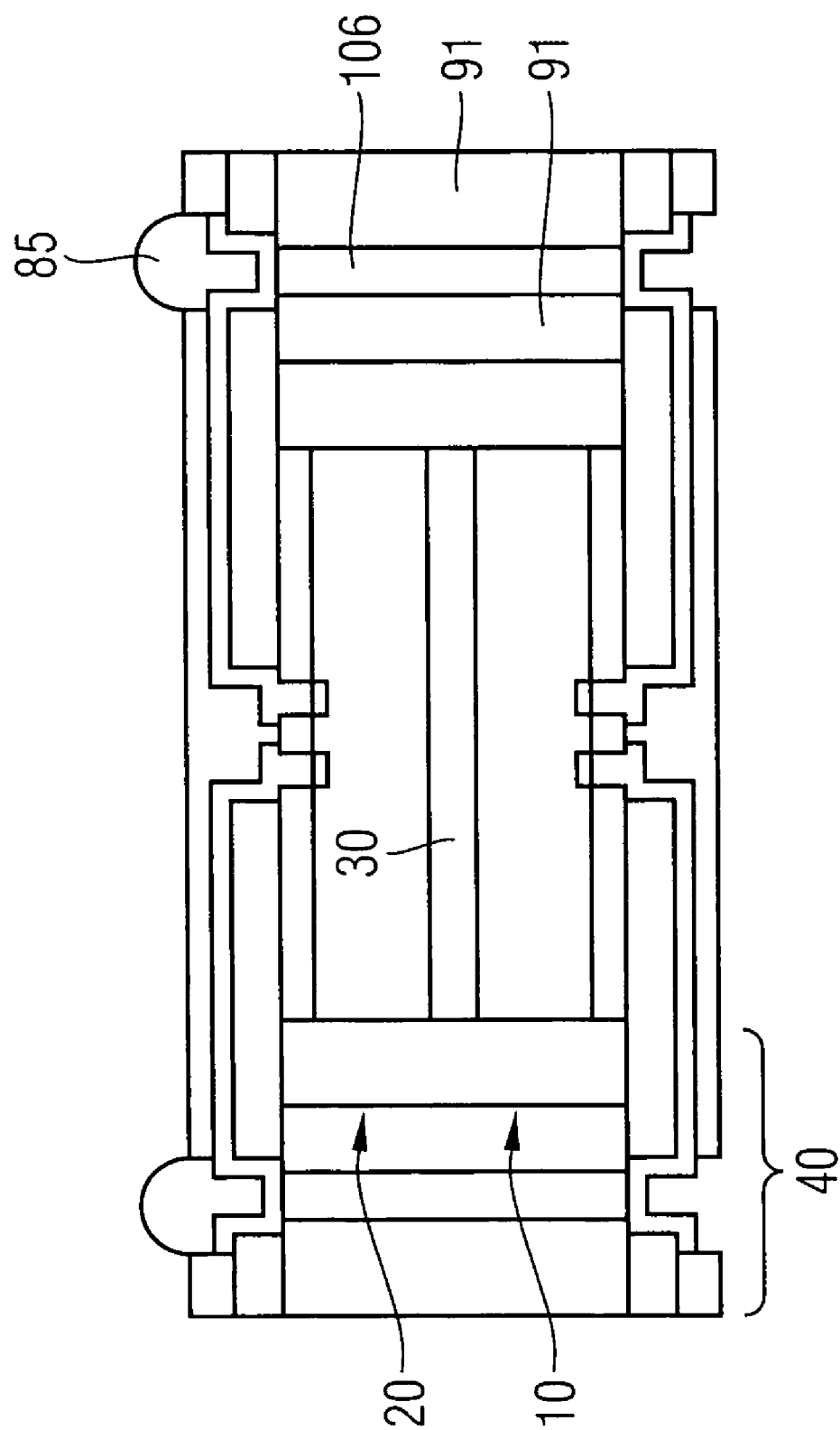

FIG. 21 diagrammatically illustrates another embodiment of the present invention. In this case, a prefabricated frame is used. The latter is constructed, in the form of a grid, from struts 91. The cavities between the struts are large enough for the semiconductor components 10, 20. The edge region is, for the most part, occupied by the frame. A gap between the struts 91 and the semiconductor components 10, 20 is filled with potting compound. The semiconductor components are thus fastened to the frame 10, 20. Holes 106 are drilled into the struts 91 and are filled with metal in order to achieve a contact via.

Figure 22:
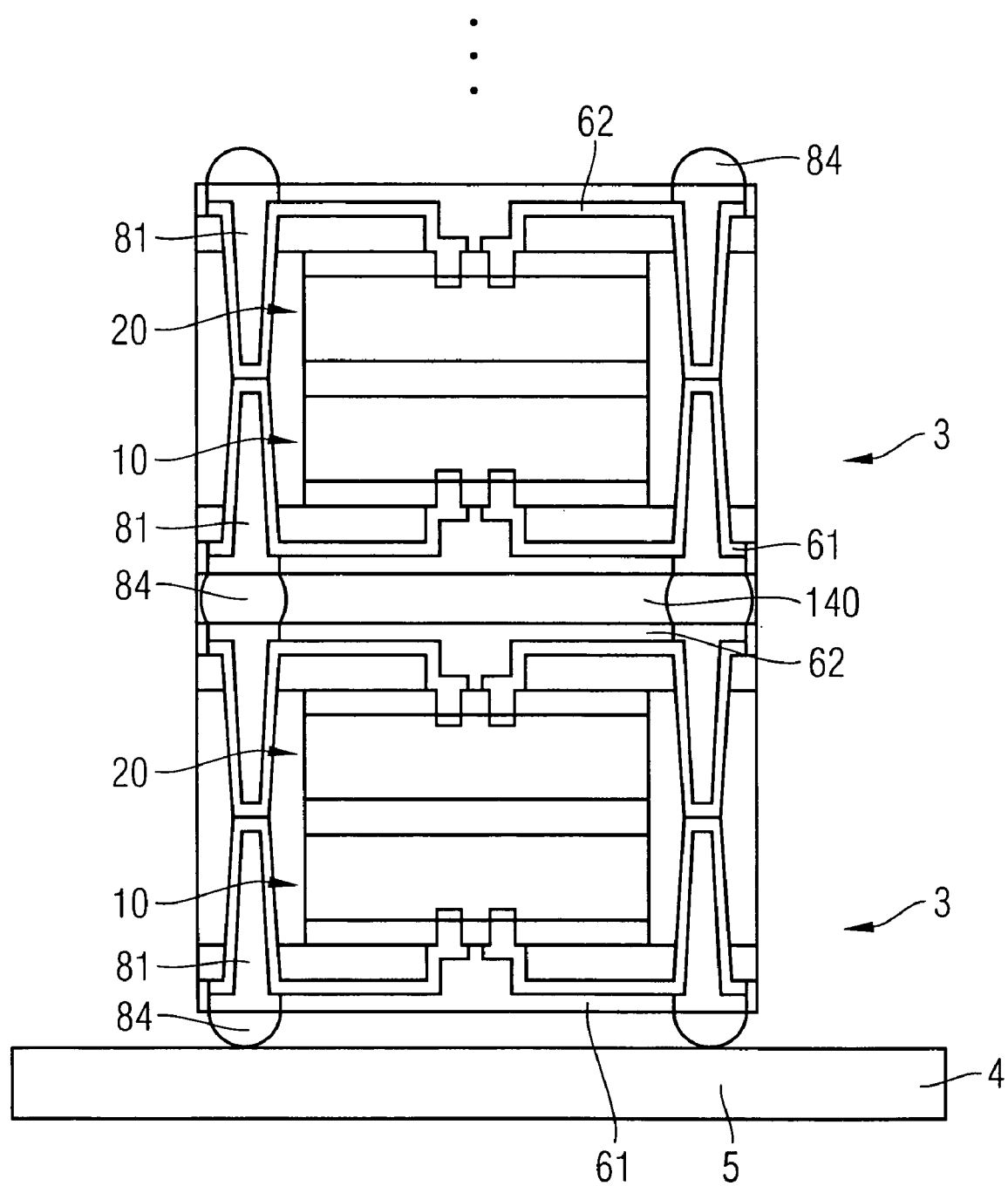
FIG. 22 is a diagrammatic illustration of installation of a stack of one embodiment on a printed circuit board.

FIG. 22 illustrates the installation of an embodiment on a printed circuit board. A lower semiconductor device 3 uses solder deposit elevations 84 to contact-connect to contact regions 5 of a printed circuit board 4. An upper semiconductor device 3 is stacked on the lower semiconductor device 3 and is electrically connected to a plug 82 of the lower semiconductor device 3 via solder deposit elevations 84. A possible adhesive layer 140 between the semiconductor devices 3 ensures mechanical stability of the stack. The number of stacked semiconductor devices 3 is not restricted.

Although modifications and changes may be suggested by those skilled in the art, it is the intention of the inventors to embody within the patent warranted hereon all changes and modifications as reasonably and properly come within the scope of their contribution to the art.

In particular, the production method is not restricted to beginning with the patterning of the first surface. Nor do the individual steps have to follow one another in the manner illustrated.

We claim:

1. A semiconductor device, comprising:
   at least one first semiconductor component being located in a first plane and comprising an active area which has a first contact region;
   at least one second semiconductor component being located in a second plane and comprising a second active area which has a second contact region; said second semiconductor component being located at a distance vertically to said first semiconductor component and being orientated relative to said first semiconductor component, so that said first active area faces away from said second semiconductor component and said second active area faces away from said first semiconductor component;
   an adhesive layer between said first and said second semiconductor components;
   a frame region laterally adjoining said first semiconductor component and said second semiconductor component on at least one side and comprising a first surface and a second surface which is located opposite to said second surface; and
   a wiring device being introduced in said frame region and connecting said first contact region to said second contact region; said wiring device comprising a first depression through said first surface into said frame region, a first wiring which connects electrically a first bottom region of said first depression to said first contact region, a second depression through said second surface into said frame region, and a second wiring connecting electrically a second bottom region of said second depression to said second contact region; said second wiring being connected to said first wiring in said second bottom region and said second bottom region adjoining said first bottom region.

2. The semiconductor device of claim 1, comprising a buffer layer being provided in said frame region in such a manner so that said buffer layer laterally adjoins at least one side of said first or second semiconductor components.

3. The semiconductor device of claim 1, wherein a third semiconductor device is arranged within said first plane next to said first semiconductor device.

4. The semiconductor device of claim 3, wherein a space between said first conductor device and said third semiconductor device is filled with a potting compound.

5. The semiconductor device of claim 4, comprising a third wiring electrically connecting said first semiconductor component with said third semiconductor device.

6. The semiconductor device of claim 1, wherein a fourth semiconductor device is arranged within said second plane next to said second semiconductor device.

7. The semiconductor device of claim 6, wherein a space between said second semiconductor device and said fourth semiconductor device is filled with a potting compound.

8. The semiconductor device of claim 7, comprising a fourth wiring electrically connecting said second semiconductor component with said fourth semiconductor device.

9. The semiconductor device of claim 1, wherein said adhesive layer comprises a core substrate with an adhesive material being applied to both of its surfaces.

10. The semiconductor device of claim 9, wherein said core substrate comprises epoxy resin.

11. The semiconductor device of claim 1, wherein at least one of said first and second depressions is filled with a conductive material.

12. The semiconductor device of claim 11, wherein a solder deposit elevation is deposited on said conductive material.

13. The semiconductor device of claim 1, wherein a prefabricated support frame is introduced in said frame region.

14. The semiconductor device of claim 13, wherein said wiring device is introduced into said prefabricated support frame.

15. The semiconductor device of claim 1, wherein said wiring device is matched to a given impedance.

16. A semiconductor device, comprising:
    at least one first semiconductor component being located in a first plane and comprising an active area which has a first contact region;
    at least one second semiconductor component being located in a second plane and comprising a second active area which has a second contact region; said second semiconductor component being located at a distance vertically to said first semiconductor component and being orientated relative to said first semiconductor component, so that said first active area faces away from said second semiconductor component and said second active area faces away from said first semiconductor component;
    an adhesive layer between said first and said second semiconductor components;
    a frame region laterally adjoining said first semiconductor component and said second semiconductor component on at least one side and comprising a first surface and a second surface which is located opposite to said second surface; and
    a wiring device being introduced in said frame region and connecting said first contact region to said second contact region; said wiring device comprising a first depression through said first surface into said frame region, a first wiring which connects electrically a first bottom region of said first depression to said first contact region, and a second wiring which is coupled electrically to said second surface, touches said first wiring in said first bottom, and is connected electrically to said second contact region; said first depression extends up to said second surface.

17. The semiconductor device of claim 16, comprising a buffer layer being provided in said frame region in such a manner so that said buffer layer laterally adjoins at least one side of said first or second semiconductor components.

18. The semiconductor device of claim 16, wherein a third semiconductor device is arranged within said first plane next to said first semiconductor device.

19. The semiconductor device of claim 18, wherein a space between said first conductor device and said third semiconductor device is filled with a potting compound.

20. The semiconductor device of claim 19, comprising a third wiring electrically connecting said first semiconductor component with said third semiconductor device.

21. The semiconductor device of claim 16, wherein a fourth semiconductor device is arranged within said second plane next to said second semiconductor device.

22. The semiconductor device of claim 21, wherein a space between said second semiconductor device and said fourth semiconductor device is filled with a potting compound.

23. The semiconductor device of claim 22, comprising a fourth wiring electrically connecting said second semiconductor component with said fourth semiconductor device.

24. The semiconductor device of claim 16, wherein said adhesive layer comprises a core substrate with an adhesive material being applied to both of its surfaces.

25. The semiconductor device of claim 24, wherein said core substrate comprises epoxy resin.

26. The semiconductor device of claim 16, wherein said first depression is filled with a conductive material.

27. The semiconductor device of claim 26, wherein a solder deposit elevation is deposited on said conductive material.

28. The semiconductor device of claim 16, wherein a prefabricated support frame is introduced in said frame region.

29. The semiconductor device of claim 28, wherein said wiring device is introduced into said prefabricated support frame.

30. The semiconductor device of claim 16, wherein said wiring device is matched to a given impedance.

31. A method for producing a plurality of semiconductor devices, comprising the steps of:
providing a temporary substrate;
dividing said temporary substrate into a plurality of sections;
applying a plurality of first semiconductor components, which each has a first active side with a first contact region and a first inactive side, on said temporary substrate in such a way, so that said first active sides face said temporary substrate, said first inactive sides face away from said substrate, only one semiconductor component of said plurality of first semiconductor components is within one of said plurality of sections and being at least partly spaced apart from a border of a respective of said section; each of said spaces between a respective of said borders and said semiconductor component of said first plurality of first components defining a frame region.
applying an adhesive layer to said first inactive sides of said first semiconductor components;
applying a plurality of second semiconductor components, each having a second active side with a second contact region and a second inactive side, to said adhesive layer, so that at least one semiconductor component of said plurality of second semiconductor components is assigned to each of said plurality of first semiconductor components and said second active side faces away from said respective semiconductor component of said plurality of first semiconductor components;
filling each of said frame regions with a potting compound at least up to said second active side; said potting device forming a self-supporting assembly;
conditioning said potting compound in such a way, so that a first surface is created being substantially flush with said second active side;
removing said temporary substrate from said self-supporting assembly;
forming a wiring device in each of said frame regions on said first surface and on a second surface which is substantially flush with said first active side; said wiring device connecting electrically said first semiconductor component with its respective second semiconductor component; and
cutting said self-supporting assembly at those location which correspond to said borders of said sections in order to obtain a plurality of first semiconductors, each comprising a semiconductor component of said plurality of semiconductor components, its respective semiconductor component of said plurality of second semiconductor components, and a respective wiring device.

32. The method of claim 31, forming said wiring device comprising the following steps:
forming a first vertical depression through said first surface into each of said frame regions; said first vertical depression having a first bottom region;
depositing and patterning a conductive film onto said first surface, so that a first wiring is formed between each of said first bottom regions and their respective first contact region;
forming a second vertical depression, which has a second bottom region, through said second surface into each of said frame regions, so that said second bottom region exposes said first bottom region; and
depositing and structuring a second conductive film onto said second surface and said second bottom region, so that a second wiring is formed between each of said second bottom regions and their respective second contact regions.

33. The method of claim 31, forming said wiring device comprising the following steps:
forming third vertical depressions through said first surface into said frame region, so that said third vertical depressions have bottom regions which are in plane with said second surface;
depositing and patterning a conductive film onto said first surface and said third bottom regions, so that a third wiring is formed between said each of said third bottom regions and said first contact regions; and depositing and patterning a second conductive film onto said second surface, so that a fourth wiring is formed between each of said third bottom regions and an respective of said second contact regions.

34. The method of claim 31, assigning at least two semiconductor components of said plurality of second components to one semiconductor component of said plurality of first semiconductor components.

35. The method of claim 34, comprising filling an interspace between two of said second semiconductor components assigned to one first semiconductor component with a potting compound.

36. The method of claim 32, comprising filling at least one of said first depression or second depression with a conductive material after said conductive film has been applied to said respective depression.

37. The method of claim 36, comprising forming a solder deposit elevations on said conductive material.

38. The method of claim 31, comprising the following further steps:
applying a first covering layer to said first wiring and said first contact regions; wherein a first opening region of said first depression is not covered.

39. The method of claim 31, comprising the following further steps:

applying a second covering layer to said second wiring and said second contact regions; wherein a second opening region of said second depression is not covered.

40. The method of claim 31, comprising the following further steps:

arranging a prefabricated support frame in the form of a grid on said temporary substrate, so that grid struts of said support frame are situated within said frame region.

41. The method of claim 40, comprising forming conductive vertical connections to said grid struts by forming a hole in said grid struts and filling said holes; and forming first wiring between said vertical connections and said first and second contact regions.

42. The method of claim 31, comprising introducing a buffer layer into said frame region (40), so that said frame region laterally adjoins at least one side of said first or second semiconductor components.

43. The method of claim 31, wherein applying said adhesive layer to said first inactive sides comprises the following steps:

applying a first layer of an adhesive material to said first inactive sides;

applying a rigid core substrate to said first layer; and applying a second layer of an adhesive material to said core substrate.

44. The method of claim 43, wherein said wiring device matches a given impedance.

45. The method of claim 31, comprising producing at least one of said first, second or third depressions using a laser beam.

* * * * *